(12) United States Patent
Lin et al.

(10) Patent No.: US 12,072,587 B2
(45) Date of Patent: Aug. 27, 2024

(54) DISPLAY DEVICE

(71) Applicant: Innolux Corporation, Miao-Li County (TW)

(72) Inventors: Feng-Ching Lin, Miao-Li County (TW); Chia-Wei Tseng, Miao-Li County (TW); Wen-Ming Hung, Miao-Li County (TW); Shu-Hui Chang, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/297,021

(22) Filed: Apr. 7, 2023

(65) Prior Publication Data

US 2023/0251531 A1     Aug. 10, 2023

Related U.S. Application Data

(63) Continuation of application No. 17/573,639, filed on Jan. 12, 2022, now Pat. No. 11,656,508.

(30) Foreign Application Priority Data

Feb. 9, 2021   (CN) .......................... 202110179323.1

(51) Int. Cl.
| | | |
|---|---|---|
| *G02F 1/1362* | (2006.01) | |
| *G02F 1/1343* | (2006.01) | |
| *G02F 1/1368* | (2006.01) | |
| *H01L 27/12* | (2006.01) | |
| *H01L 29/786* | (2006.01) | |

(52) U.S. Cl.
CPC .. *G02F 1/134327* (2013.01); *G02F 1/134372* (2021.01); *G02F 1/136286* (2013.01); *G02F 1/1368* (2013.01); *H01L 27/124* (2013.01); *H01L 29/78633* (2013.01)

(58) Field of Classification Search
CPC .................................................... G02F 1/13628
See application file for complete search history.

(56) References Cited

U.S. PATENT DOCUMENTS

| | | | | |
|---|---|---|---|---|
| 2007/0023754 A1* | 2/2007 | Zhong | ............... | H01L 29/78636 257/E27.111 |
| 2016/0062203 A1* | 3/2016 | Ono | .................... | G02F 1/13439 438/30 |
| 2016/0327845 A1* | 11/2016 | Kim | .................. | G02F 1/134309 |
| 2019/0227394 A1* | 7/2019 | Higashi | ............. | G02F 1/133512 |
| 2020/0357956 A1* | 11/2020 | Chen | ..................... | H01L 33/382 |
| 2021/0397051 A1* | 12/2021 | Ikeda | ................ | G02F 1/134309 |

* cited by examiner

*Primary Examiner* — Sang V Nguyen
(74) *Attorney, Agent, or Firm* — JCIPRNET

(57) ABSTRACT

A display device includes a substrate, a transistor, a pixel electrode, a first conductive layer and a second conductive layer. The transistor is disposed on the substrate. The pixel electrode is disposed on the substrate. The pixel electrode is electrically connected to the transistor. The first conductive layer is disposed on the pixel electrode. The first conductive layer has a first slit. The second conductive layer is disposed on the pixel electrode. The second conductive layer has a second slit. The first slit and the second slit are overlapped with the pixel electrode.

11 Claims, 7 Drawing Sheets

DISPLAY DEVICE

CROSS-REFERENCE TO RELATED APPLICATION

This application is a continuation application of and claims the priority benefit of a prior application Ser. No. 17/573,639, filed on Jan. 12, 2022. The prior application Ser. No. 17/573,639 claims the priority benefit of China application serial no. 202110179323.1, filed on Feb. 9, 2021. The entirety of each of the above-mentioned patent applications is hereby incorporated by reference herein and made a part of this specification.

BACKGROUND

Technical Field

The disclosure relates to an electronic device, and more particularly to an electronic display device having a display function.

Description of Related Art

As the application of electronic devices continues to expand, the development of display technology is also changing with each passing day. With the application of the electronic devices and the habits or requirements of users, the requirements for the structure and quality of the electronic devices are becoming higher, such that the electronic devices are faced with different issues. Therefore, the research and development of the electronic devices must be continuously updated and adjusted.

SUMMARY

The disclosure provides a display device having good display quality.

According to an embodiment of the disclosure, the display device includes a substrate, a transistor, a second transistor, a pixel electrode, a first conductive layer and a second conductive layer. The transistor is disposed on the substrate. The pixel electrode is disposed on the substrate. The pixel electrode is electrically connected to the transistor. The first conductive layer is disposed on the pixel electrode. The first conductive layer has a first slit. The second conductive layer is disposed on the pixel electrode. The second conductive layer has a second slit. The first slit and the second slit are overlapped with the pixel electrode.

In summary, in the display device of an embodiment of the disclosure, since the first slit spans from the first pixel electrode to the second pixel electrode, a horizontal lateral electric field generated by the first slit and the first pixel electrode or the second pixel electrode may be increased, or a vertical lateral electric field generated by the first slit and the first pixel electrode or the second pixel electrode may be reduced. Therefore, the liquid crystal efficiency of pixels can be improved, thereby increasing the area of bright fringes of the pixels. The display device can have good display quality.

DETAILED DESCRIPTION OF DISCLOSED EMBODIMENTS

Figure 1:
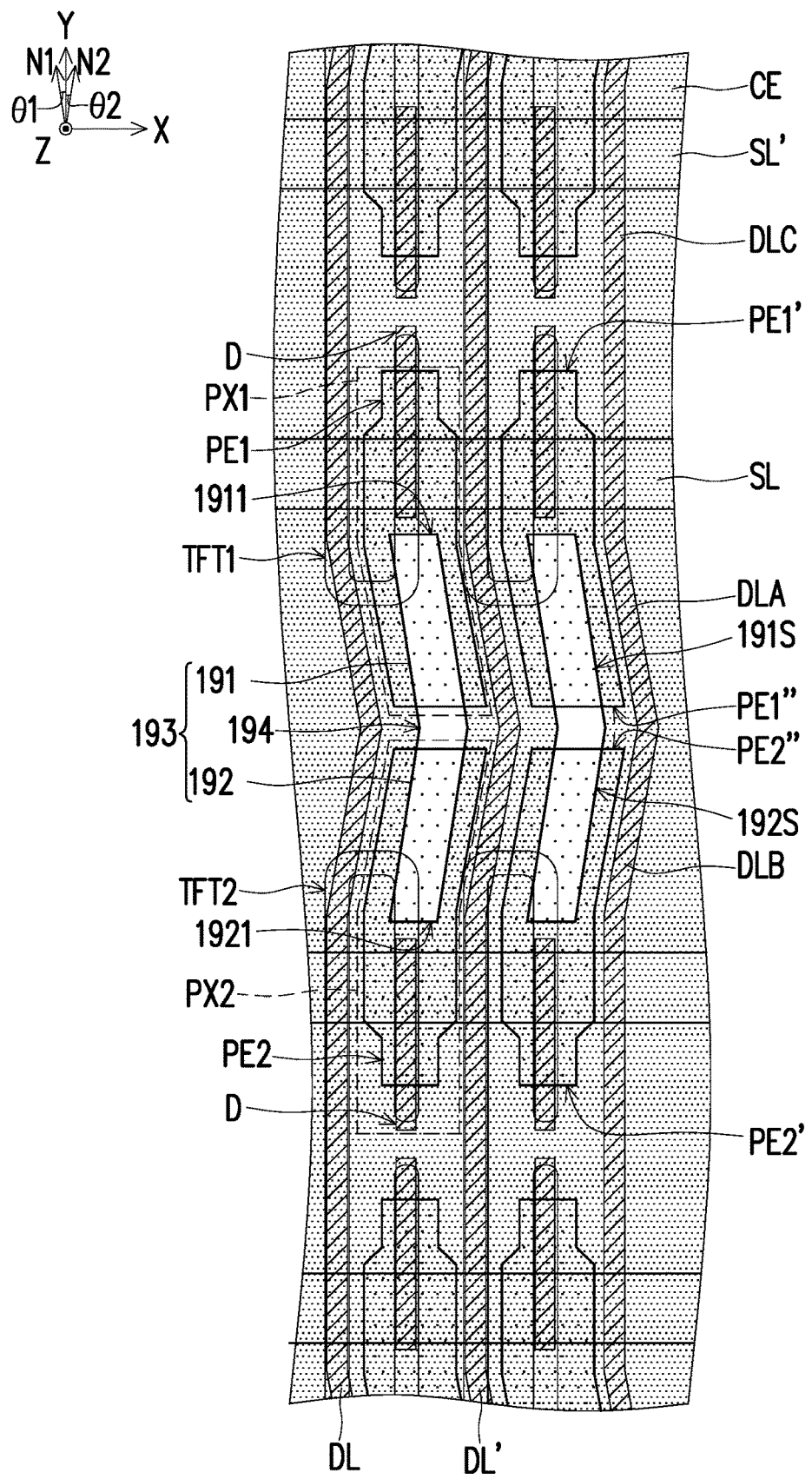
FIG. 1 is a top schematic view of a display device according to an embodiment of the disclosure.

The disclosure may be understood by referring to the following detailed description in conjunction with the accompanying drawings. It should be noted that in order to facilitate the understanding by the reader and the conciseness of the drawings, multiple drawings in the disclosure only depict a portion of the electronic device, and specific elements in the drawings are not drawn according to actual scale. In addition, the number and size of each element in the drawings are only for illustration and are not intended to limit the scope of the disclosure.

Throughout the disclosure and the appended claims, certain words are used to refer to specific elements. Persons skilled in the art should understand that electronic device manufacturers may refer to the same elements by different names. The disclosure does not intend to distinguish the elements with the same function but different names. In the following description and claims, words such as "including", "containing", and "having" are open-ended words, which should be interpreted as "containing but not limited to . . . ". Therefore, when the terms "including", "containing", and/or "having" are used in the description of the disclosure, the terms specify the presence of corresponding features, regions, steps, operations, and/or components, but do not exclude the presence of one or more corresponding features, regions, steps, operations, and/or components.

Directional terms such as "upper", "lower", "front", "rear", "left", and "right" mentioned in the disclosure are only with reference to the directions of the drawings. Therefore, the directional terms used are used to illustrate but not to limit the disclosure. In the drawings, each drawing shows the general features of a method, a structure, and/or a material used in a specific embodiment. However, the drawings should not be construed as defining or limiting the scope or nature covered by the embodiments. For example, for the sake of clarity, the relative size, thickness, and position of each film layer, region, and/or structure may be reduced or enlarged.

In the disclosure, a length and a width may be measured by adopting an optical microscope, and a thickness may be measured by a cross-sectional image in an electron microscope, but not limited thereto.

The terms "approximately", "equal to", "equivalent" or "the same", and "substantially" or "roughly" are generally interpreted as being within a range of 20% of a given value or interpreted as being within a range of 10%, 5%, 3%, 2%, 1%, or 0.5% of a given value.

A structure (or layer, part, substrate) being located on another structure (or layer, element, substrate) described in the disclosure may mean that the two structures are adjacent and directly connected or may mean that the two structures are adjacent instead of directly connected. Indirect connection means that there is at least one intermediate structure (or intermediate layer, intermediate part, intermediate substrate, intermediate interval) between the two structures, a lower surface of one structure is adjacent to or directly connected to an upper surface of the intermediate structure, an upper surface of the other structure is adjacent to or directly connected to a lower surface of the intermediate structure, and the intermediate structure may be composed of a single-layer or a multi-layer physical structure or a non-physical structure, but not limited thereto. In the disclosure, when a certain structure is configured "on" another structure, it may mean that the certain structure is "directly" on another structure or may mean that the certain structure is "indirectly" on another structure, that is, there is at least one structure sandwiched between the certain structure and another structure. In the disclosure, "connection" may mean that a certain structure "directly" contacts another structure or may mean that the certain structure "indirectly" contacts another structure but is "connected to" another structure through other elements. In the disclosure, "electrical connection" may mean that a certain structure "directly" electrically contacts another structure or may mean that the certain structure "indirectly" electrically contacts another structure but is "electrically connected" to another structure through other elements.

"First", "second", etc. in the specification of the disclosure may be used to describe various elements, parts, regions, layers, and/or portions, but the elements, parts, regions, and/or portions should not be limited by the terms. The terms are only used to distinguish one element, part, region, layer, or portion from another element, part, region, layer, or portion. Therefore, a first "element", "part", "region", "layer", or "portion" discussed below are used to distinguish from a second "element", "part piece", "region", "layer", or "portion" and are not used to limit the sequence or specific elements, parts, regions, layers, and/or portions. Moreover, the "first" element in the paragraphs of the specification may be renamed as the "second" element in the claims.

An electronic device may have a display function. An electronic display device of the embodiment of the disclosure may include a display device, an antenna device, a sensing device, a splicing device, or a transparent display device, but not limited thereto. The electronic device may be a curlable, stretchable, bendable, or flexible electronic device. The electronic device may, for example, include a liquid crystal, light emitting diode (LED), quantum dot (QD), fluorescence, phosphor, other suitable materials and the materials may be arbitrarily arranged and combined, other suitable display media, or a combination of the above. The light emitting diode may, for example, include an organic LED (OLED), a mini LED, a micro LED, or a quantum dot LED (QLED or QDLED), but not limited thereto. The antenna device may be, for example, a liquid crystal antenna, but not limited thereto. The splicing device may be, for example, a display splicing device or an antenna splicing device, but not limited thereto. It should be noted that the electronic device may be any combination of the above, but not limited thereto. In addition, the appearance of the electronic device may be a rectangle, a circle, a polygon, a shape with a curved edge, or other suitable shapes. The electronic device may have a peripheral system such as a driving system, a control system, a light source system, and a rack system to support the display device, the antenna device, or the splicing device. Hereinafter, the electronic display device having the display function will be used to illustrate the content of the disclosure, but the disclosure is not limited thereto.

In the disclosure, the various embodiments described below may be mixed and matched without departing from the spirit and scope of the disclosure. For example, some features of one embodiment may be combined with some features of another embodiment to become another embodiment.

Reference will now be made in detail to the exemplary embodiments of the disclosure, and examples of the exemplary embodiments are illustrated in the accompanying drawings. Whenever possible, the same reference numerals are used in the drawings and description to represent the same or similar parts.

Figure 2:
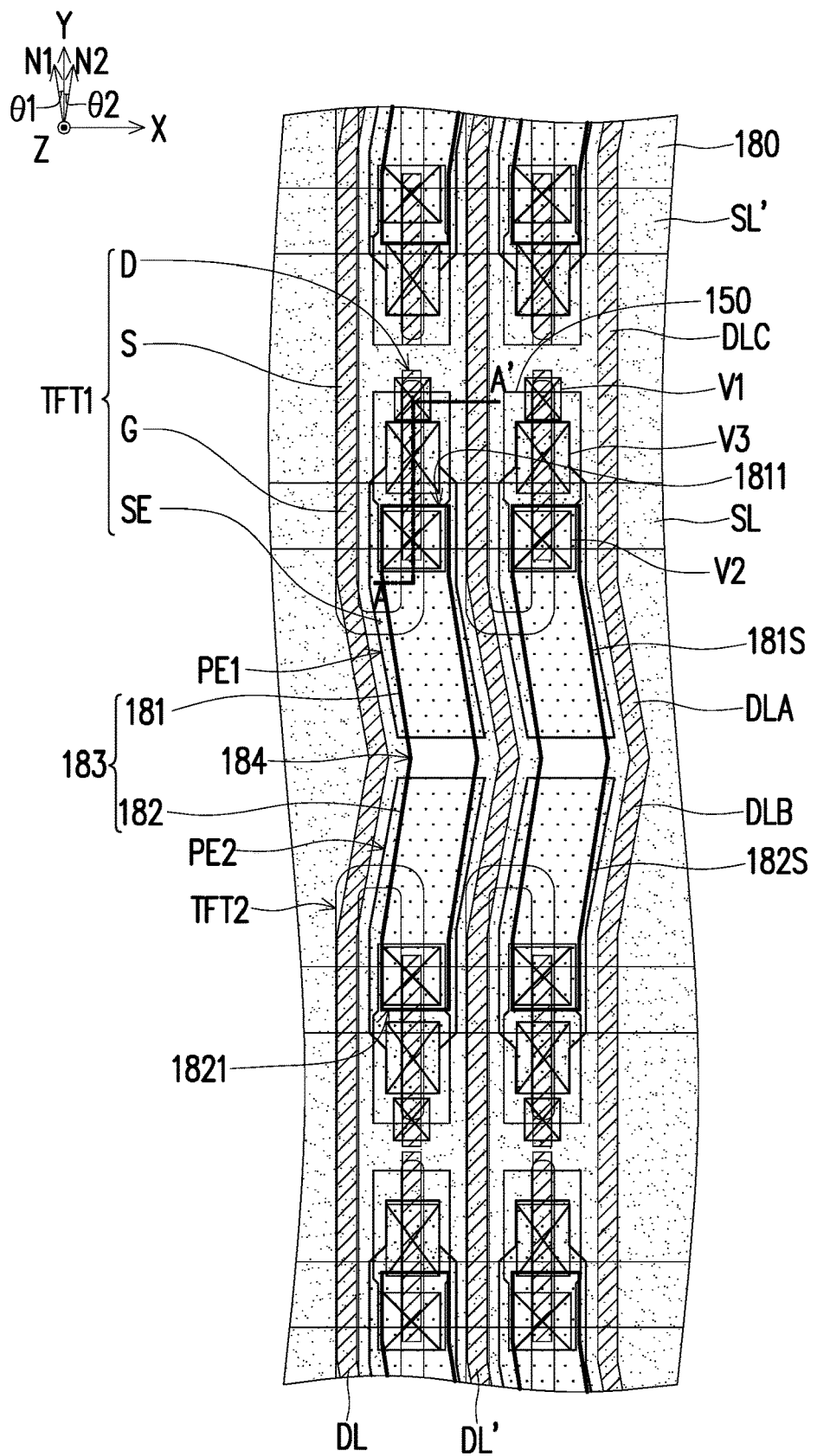
FIG. 2 is a top schematic view of the display device according to an embodiment of the disclosure.
Figure 3:
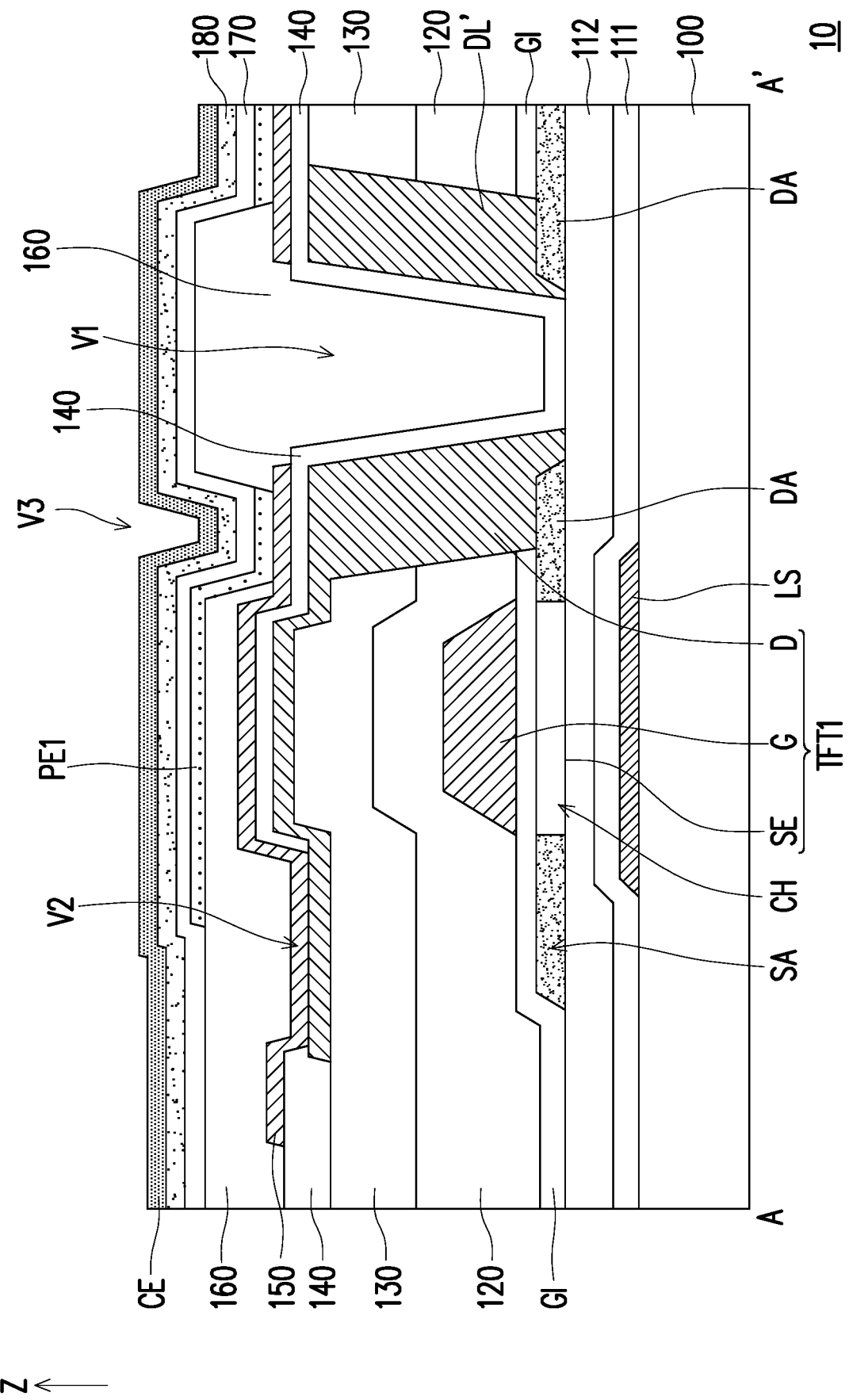
FIG. 3 is a cross-sectional schematic view of the display device of FIG. 1 along a cross-sectional line A-A'.

FIG. 1 is a top schematic view of a display device according to an embodiment of the disclosure, which may be, for example, a display panel or a splicing display panel in the embodiment. For clarity of the drawings and convenience of description, FIG. 1 omits showing several elements. FIG. 2 is a top schematic view of the display device according to an embodiment of the disclosure. The difference between FIG. 2 and FIG. 1 is that FIG. 1 shows a common electrode layer CE and a first slit 193. For clarity of the drawings and convenience of description, FIG. 2 omits showing several elements (for example, the common electrode layer CE and the first slit 193). FIG. 2 shows a conductive layer 180, a second slit 183, a bridging layer 150, and conductive vias V1, V2, and V3. FIG. 3 is a cross-sectional schematic view of the display device of FIG. 2 along a cross-sectional line A-A'. Please refer to FIG. 1, FIG. 2, and FIG. 3. The display device of the disclosure may include a display panel, but not limited thereto. Illustrating with an embodiment of the disclosure, a display device 10 includes a substrate 100, a first transistor TFT1, a second transistor TFT2, a first pixel electrode PE1, a second pixel electrode PE2, and the common electrode layer CE. In some embodiments, the first transistor TFT1 and the second transistor TFT2 are disposed on the substrate 100. The display device 10 also includes multiple pixels arranged into a pixel array on an X-axis and a Y-axis perpendicular to the X-axis. A Z-axis is perpendicular to the X-axis and the Y-axis. The pixels include a first pixel PX1 and a second pixel PX2. The first pixel electrode PE1 is electrically connected to the first transistor TFT1, and the second pixel electrode PE2 is electrically connected to the second transistor TFT2. Each pixel (for example, the first pixel PX1) is defined as a region (for example, a dashed box) where a pixel electrode (for example, the first pixel electrode PE1) is disposed. At least a portion of the region may emit a single color light. In the embodiment, the first pixel PX1 and the second pixel PX2 may emit light with the same color, but not limited thereto. The first pixel electrode PE1 of the first pixel PX1 is disposed adjacent to the second pixel electrode PE2 of the second pixel PX2 on the Y-axis. In some embodiments, in a normal direction of the substrate 100 (that is, on the Z-axis), the common electrode layer CE overlaps with a portion of the first pixel electrode PE1 and a portion of the second pixel electrode PE2. The common electrode layer CE has the first slit 193. In a direction roughly along the Y-axis, the first slit 193 spans from the first pixel electrode PE1 to the second pixel electrode PE2. In some embodiments, "span" may be defined as a structure being continuously disposed while overlapping with two elements. For example, the first slit 193 is disposed on the first pixel electrode PE1 and the second pixel electrode PE2 while partially overlapping with the first pixel electrode PE1 and the second pixel electrode PE2. Under the above configuration, the first slit 193 may reduce the influence of a fringe field in a vertical direction (for example, on the Y-axis) on the driving of liquid crystal molecules, thereby improving the efficiency of liquid crystal. In this way, the transmittance or the contrast of the pixels of the display device 10 can be improved. The display device 10 can have good display quality.

Please refer to FIG. 1, FIG. 2, and FIG. 3. The display device 10 includes the substrate 100. The substrate 100 includes a rigid substrate, a soft substrate, or a combination of the above. For example, the substrate 100 includes glass, quartz, sapphire, acrylic resin, polycarbonate (PC), polyimide (PI), polyethylene terephthalate (PET), other suitable transparent materials, or a combination of the above, but not limited thereto.

The display device 10 includes an insulation layer 111 and an insulation layer 112 disposed on the substrate 100. The insulation layer 111 is disposed on the substrate 100. The insulation layer 112 is disposed on the insulation layer 111. The material of the insulation layer 111 includes silicon nitride, but not limited thereto. The material of the insulation layer 112 includes silicon oxide, but not limited thereto.

In some embodiments, the display device 10 may also optionally include a light shielding layer LS (as shown in FIG. 3). The light shielding layer LS is disposed between the substrate 100 and the insulation layer 111. In some embodiments, the light shielding layer LS may be disposed on a buffer layer, but not limited thereto. The material of the light shielding layer LS includes metal or other suitable light shielding materials, but not limited thereto. For example, the material of the light shielding layer LS is molybdenum. In some embodiments, the light shielding layer LS is, for example, a configuration of a semiconductor layer overlapping with a transistor to reduce light leakage current or improve flickering. The configuration of the transistor will be briefly explained in the subsequent paragraphs.

In other embodiments, the light shielding layer LS may also be used as a bottom gate of the transistor. In other words, a thin film transistor in the embodiment of the disclosure may include a top gate, bottom gate, double gate or dual gate, or other suitable thin film transistors, but not limited thereto.

In some embodiments, before the insulation layer 111 and the light shielding layer LS are disposed, another insulation layer (not shown) may be optionally disposed between the light shielding layer LS and the substrate 100 as a buffer function. In other embodiments, when the light shielding layer LS is not disposed, the insulation layer 111 and the insulation layer 112 may be applied as buffer layers.

The display device 10 also includes multiple insulation layers sequentially disposed on the substrate 100 on the Z-axis. For example, the display device 10 includes a gate insulation layer GI, an insulation layer 120, an insulation layer 130, an insulation layer 140, an insulation layer 160, and an insulation layer 170 sequentially stacked on the Z-axis. The gate insulation layer GI, the insulation layer 120, the insulation layer 130, the insulation layer 140, the insulation layer 160, and the insulation layer 170 may have a single-layer or multi-layer structure, and the material thereof is, for example, an insulating material. For example, the insulating material may include an organic material, an inorganic material, or a combination of the above. The organic material may include polyethylene terephthalate (PET), polyethylene (PE), polyethersulfone (PES), polycarbonate (PC), polymethylmethacrylate (PMMA), polyimide (PI), photo sensitive polyimide (PSPI), or a combination of the above, and the inorganic material may include silicon nitride, silicon oxide, silicon oxynitride, or a combination of the above, but not limited thereto.

The display device 10 includes a transistor array disposed on the substrate 100. The transistor array includes multiple transistors, such as the first transistor TFT1 and the second transistor TFT2. The transistor is, for example, a thin film transistor (TFT), but not limited thereto. In some embodiments, the transistors (for example, the first transistor TFT1 and the second transistor TFT2) are arranged into an array respectively along the X-axis and the Y-axis. For example, multiple first transistors TFT1 may be arranged into multiple columns along the X-axis. Multiple second transistors TFT2 may be arranged into multiple columns along the X-axis. Taking FIG. 1 or FIG. 2 as an example, multiple transistors may be disposed into another column adjacent to the top of the first transistor TFT1 on the Y-axis. In addition, multiple transistors may be disposed into another column adjacent to the bottom of the second transistor TFT2 on the Y-axis. In other words, the two columns of transistors may be adjacently disposed, but not limited thereto. In the embodiment of the disclosure, the definition of adjacent is, for example, that no other identical element is disposed between two identical elements (for example, two transistors).

The transistor (for example, the first transistor TFT1 or the second transistor TFT2) includes a semiconductor layer SE, a gate G, a source S, and a drain D. The semiconductor layer SE is disposed on the insulation layer 112. In some embodiments, in the normal direction of the substrate 100 (that is, on the Z-axis), the semiconductor layer SE overlaps with the light shielding layer LS. The material of the semiconductor layer SE is, for example, low temperature polysilicon (LTPS) or amorphous silicon, but not limited thereto. In other embodiments, the material of the semiconductor layer SE includes amorphous silicon, polycrystalline silicon, single crystal silicon, Ge, other suitable compound semiconductors, or other suitable alloy semiconductors. The compound semiconductor may include GaN, SiC, GaAs, GaP, InP, InAs, and/or InSb. The alloy semiconductor may include SiGe alloy, GaAsP alloy, AlInAs alloy, AlGaAs alloy, GaInAs alloy, GaInP alloy, GaInAsP alloy, or a combination of the above. In other embodiments, the material of the semiconductor layer SE also includes CdTe or CdS. The material of the semiconductor layer SE may also include, but is not limited to, a metal oxide, such as IGZO, IZO, IGZTO, an organic semiconductor containing a polycyclic aromatic compound, or a combination of the above. In some embodiments, the semiconductor layer SE may be doped with a p-type or n-type dopant.

In some embodiments, the light shielding layer LS may be applied as the gate of the transistor, but not limited thereto. The type of the transistor has been explained in the above paragraph, so there will be no repetition here.

In some embodiments, the semiconductor layer SE may include a source doped area SA, a drain doped area DA, and a channel area CH located between the two. Two ends of the semiconductor layer SE may be respectively doped to form the source doped area SA and the drain doped area DA. The source doped area SA and the drain doped area DA may be respectively electrically connected to the source S and/or the drain D, but not limited thereto.

The gate insulation layer GI is disposed on the semiconductor layer SE. The gate G is disposed on the gate insulation layer GI. The material of the gate G may include molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), silver (Ag), aurum (Au), other suitable metals, or an alloy or a combination of the above materials, but not limited thereto.

The insulation layer 120 is disposed on the gate G, the insulation layer 130 is disposed on the insulation layer 120, and the insulation layer 120 and the insulation layer 130 may be penetrated by the conductive via V1, but not limited thereto.

The source S and the drain D are disposed on the insulation layer 130. The source S and the drain D may be electrically connected to the source doped area SA and/or the drain doped area DA of the semiconductor layer SE through the conductive via V1 penetrating the insulation layer 120 and the insulation layer 130. The materials of the source S and the drain D may be similar to the gate G, so there will be no repetition here.

In some embodiments, the gate G may be a portion of a scanning line SL. Specifically, the gate G may be the portion of the scanning line SL overlapping with the semiconductor layer SE, but not limited thereto. Multiple scanning lines SL and SL' extend, for example, along the X-axis. As shown in FIG. 1 or FIG. 2, the scanning line SL is disposed adjacent to the scanning line SL'.

The source S may be a portion of a data line DL. Data lines DL and DL' extend, for example, roughly along the Y-axis. In some embodiments, an extension direction of the scanning line SL (that is, the X-axis) is roughly perpendicular to an extension direction of the data line DL (that is, the Y-axis). The data line DL and the scanning line SL may be cross-disposed on the substrate 100, but not limited thereto.

In some embodiments, the data line DL roughly extends along the Y-axis and may include a main portion DLC, a first bending portion DLA, and a second bending portion DLB. The main portion DLC may be disposed parallel to the Y-axis. The first bending portion DLA and the second bending portion DLB are located between the main portions DLC and may be respectively connected to the main portions DLC and extend along a first direction N1 and a second direction N2. The second bending portion DLB may be connected to the first bending portion DLA. The first direction N1 and the second direction N2 are not parallel to the X-axis or the Y-axis. The first direction N1 and the second direction N2 respectively have included angles θ1 and θ2 with the Y-axis. The first direction N1 and the second direction N2 intersect. In some embodiments, the included angle θ1 between the first direction N1 and the Y-axis and the included θ1 angle θ2 between the second direction N2 and the Y-axis may be the same or different, but the disclosure is not limited thereto. In the embodiment, the angles of the included angle θ1 and the included angle θ2 are the same. The included angle θ1 and the included angle θ2 are greater than zero degrees and less than 90 degrees. In the embodiment, the included angle θ1 and the included angle θ2 are 10 degrees, but not limited thereto. In this way, at least a portion of the data line DL, such as the first bending portion DLA and the second bending portion DLB, may form a ">" shape.

In some embodiments, the drain D and the source S or the data line DL may be formed by patterning a conductive material through the same photomask, but not limited thereto. In other embodiments, the drain D and the source S may also be formed in layers in different steps of a manufacturing process. In some embodiments, the drain D is electrically connected to the drain doped area DA of the semiconductor layer SE through the conductive via V1 penetrating the insulation layer 120 and the insulation layer 130, but not limited thereto. In the embodiment of the disclosure, the conductive via V1 penetrating the insulation layer 120, the insulation layer 130, and the insulation layer 140 means that the insulation layer 120, the insulation layer 130, and the insulation layer 140 have the conductive via V1. In the subsequent paragraphs, the definitions of other conductive vias are also similar to the definition of the conductive via V1 described above and are analogized, so there will be no repetition in the subsequent paragraphs.

The insulation layer 140 is disposed on the insulation layer 130 and covers the data line DL and the drain D. The conductive via V1 penetrates the insulation layer 120 and the insulation layer 130. The drain D is electrically connected to the semiconductor layer SE through the conductive via V1.

The display device 10 may also optionally include the bridging layer 150. The bridging layer 150 is disposed on the insulation layer 140 and is electrically connected to the drain D of the transistor (for example, the first transistor TFT1 or the second transistor TFT2) through the conductive via V2. The conductive via V2 penetrates the insulation layer 140. The bridging layer 150 may be electrically connected to the drain D through the conductive via V2. The material of the bridging layer 150 may be similar to the gate G, the source S, or the drain D, so there will be no repetition here.

The insulation layer 160 is disposed on the insulation layer 140 and covers the bridging layer 150. A portion of the insulation layer 160 is filled into the conductive via V1, but not limited thereto. The conductive via V3 penetrates the insulation layer 160. The bridging layer 150 overlaps with the conductive via V3.

The pixel electrode is disposed on the insulation layer 160. The pixel electrode includes, for example, the first pixel electrode PE1 and the second pixel electrode PE2. The materials of the first pixel electrode PE1 and the second pixel electrode PE2 include transparent conductive materials, such as indium tin oxide (ITO), but not limited thereto. The first pixel electrode PE1 (or the second pixel electrode PE2) is electrically connected to the bridging layer 150 through the conductive via V3. In some embodiments, the second pixel electrode PE2 is electrically connected to another bridging layer 150 and the second transistor TFT2. In some embodiments, the first pixel electrode PE1 is electrically connected to the first transistor TFT1 through the bridging layer 150. In this way, the quality of the electrical connection between the pixel electrode and the transistor can be improved. The electrical quality of the display device 10 can be improved.

In other embodiments, the first pixel electrode PE1 (or the second pixel electrode PE2) may also be directly electrically connected to the transistor through the conductive via V3 without passing through the bridging layer 150, but not limited thereto. Under the above configuration, the manufacturing method of the display device 10 can be simplified or the cost can be saved.

In some embodiments, the first pixel PX1 and the second pixel PX2 may be adjacently disposed on the Y-axis. From another perspective, multiple first pixels PX1 may be arranged into one column on the X-axis. Multiple second pixels PX2 may be arranged into one column on the X-axis. Two scanning lines SL respectively overlap with a portion of the first pixels PX1 or a portion of the second pixels PX2. The first pixel electrode PE1 of the first pixels PX1 and the second pixel electrode PE2 of the second pixels PX2 in two adjacent columns are located between the two scanning lines SL. In addition, the first pixel PX1 and the second pixel PX2 are located between the adjacent data line DL and data line DL'.

The insulation layer 170 is disposed on the pixel electrode. A portion of the insulation layer 170 may be filled into the conductive via V3, but not limited thereto.

The display device 10 may optionally include the conductive layer 180. The conductive layer 180 is disposed on the insulation layer 170. A portion of the conductive layer 180 is filled into the conductive via V3, but not limited thereto. The conductive layer 180 is disposed between the first pixel electrode PE1 and the common electrode layer CE. The material of the conductive layer 180 may be similar to the gate G, the source S, or the drain D, so there will be no repetition here.

As shown in FIG. 2, in the normal direction of the substrate 100 (that is, on the Z-axis), the conductive layer 180 is disposed on the scanning lines SL and SL' and the data lines DL and DL'. The conductive layer 180 may overlap with portions of the scanning lines SL and SL', the data lines DL and DL', the transistor, and the pixel electrode. In this way, the conductive layer 180 has the effect of shielding the scanning line SL, the data line DL, and the transistor. Therefore, the display quality of the display device 10 can be improved. The conductive layer 180 has the second slit 183. In the direction roughly along the Y-axis, the second slit 183 spans from the first pixel electrode PE1 to the second pixel electrode PE2.

The common electrode layer CE is disposed on the conductive layer 180. In some embodiments, the common electrode layer CE is disposed on the pixel electrode and has different potentials. In this way, an electric field may be generated between the pixel electrode and the common electrode layer CE to drive the liquid crystal molecules (not shown). According to some embodiments of the disclosure, the display device 10 is, for example, a liquid crystal display device applying fringe field switching (FFS) technology, but not limited thereto. The material of the common electrode layer CE is, for example, a transparent conducting oxide (TCO) electrode, such as an indium tin oxide (ITO) electrode or an indium doped zinc oxide (IZO) electrode, but not limited thereto.

Please refer to FIG. 1 and FIG. 2. The first pixel PX1 and the second pixel PX2 are adjacently disposed. In detail, the first pixel electrode PE1 and the second pixel electrode PE2 respectively have two opposite ends. The end PE1' of the first pixel electrode PE1 is electrically connected to the first transistor TFT1, and the end PE1" is adjacent to the second pixel electrode PE2. The end PE2' of the second pixel electrode PE2 is electrically connected to the second transistor TFT2, and the end PE2" is adjacent to the first pixel electrode PE1. In an embodiment of the disclosure, an end may be defined as counting from a point where the width of the element starts to change. In this way, under the requirement of high-resolution display, the display device 10 can maintain the aperture ratio. Therefore, the display device 10 has good display quality.

In some embodiments, the first slit 193 of the common electrode layer CE may overlap with adjacent portion of the first pixel PX1 and portion of the second pixel PX2. In the embodiment of the disclosure, unless otherwise specified, the definition of overlap may be that two elements are completely overlapped, a portion of one element overlaps with a portion of another element, or a portion of one element is completely overlapped by another element.

An extension direction of the first slit 193 is roughly parallel to the Y-axis. It is worth noting that in the embodiment, the first slit 193 has a first portion 191 and a second portion 192 connected to the first portion 191. An extension direction of the first portion 191 is different from an extension direction of the second portion 192. For example, an edge 191S of the first portion 191 may be parallel to the first bending portion DLA of the data line DL and extend along the first direction N1. An edge 192S of the second portion 192 may be parallel to the second bending portion DLB of the data line DL and extend along the second direction N2. The extension direction of the first portion 191 and the extension direction of the second portion 192 may respectively have the included angles θ1 and θ2 with the Y-axis, and the extension directions intersect each other. In this way, the first portion 191 and the second portion 192 may form the ">" shape. The included angle θ1 and the included angle θ2 are greater than zero degrees and less than 90 degrees. In the embodiment, the included angle θ1 and the included angle θ2 are 10 degrees, but not limited thereto. In the normal direction of the substrate 100, the first portion 191 overlaps with a portion of the first pixel electrode PE1, and the second portion 192 overlaps with a portion of the second pixel electrode PE2. It is worth noting that the first slit 193 spans from the first pixel electrode PE1 of the first pixel PX1 to the second pixel electrode PE2 of the second pixel PX2.

Since the first slit 193 overlaps with a portion of the first pixel electrode PE and a portion of the second pixel electrode PE2, the influence of the electric field generated by the common electrode layer CE and the pixel electrode on a region between the first pixel electrode PE1 and the second pixel electrode PE2 may be reduced. In other words, under the above configuration, a horizontal lateral electric field (that is, the X-axis direction) generated by the first slit 193 and the first pixel electrode PE1 or the second pixel electrode PE2 may be increased, or a vertical lateral electric field (that is, the Y-axis direction) generated by the first slit 193 and the first pixel electrode PE1 or the second pixel electrode PE2 may be reduced. Therefore, the liquid crystal efficiency of the pixels can be improved, thereby increasing the area of bright fringes of the pixels. The display device 10 can have good display quality.

In addition, in the normal direction of the substrate 100 (that is, on the Z-axis), the first slit 193 has a turning portion 194 connecting the first portion 191 and the second portion 192. The turning portion 194 is located between the first pixel electrode PE1 and the second pixel electrode PE2. In the embodiment, the turning portion 194 may be defined as a point where the first portion 191 extending in the first direction N1 intersects with the second portion 192 extending in the second direction N2. In other embodiments, the turning portion 194 may be defined as a region counting from the start of an edge of the first portion 191 extending in the first direction N1 toward the second direction N2 to the start of the second portion 192 extending in the second direction N2. In the embodiment, the first slit 193 has two opposite ends 1911 and 1921. The first transistor TFT1 overlaps with the end 1911 of the first slit 193. The second transistor TFT2 overlaps with the end 1921 of the first slit 193. In some embodiments, the two ends 1911 and 1921 of the first slit 193 may include arc-shaped edges, but not limited thereto.

The main portion DLC of the data line DL or the data line DL' may extend along the Y-axis direction, but the first bending portion DLA extending along the first direction N1 and the second bending portion DLB extending along the second direction N2 are disposed near the first slit 193. The first direction N1 and the second direction N2 are not parallel to the X-axis or the Y-axis. The first direction N1 and the second direction N2 respectively have the included angles θ1 and θ2 with the Y-axis. The first direction N1 and the second direction N2 intersect. The edge 191S of the first portion 191 is adjacent to the first bending portion DLA, and the edge 191S is parallel to the first bending portion DLA. The edge 192S of the second portion 192 is adjacent to the second bending portion DLB, and the edge 192S is parallel to the second bending portion DLB. In other embodiments, the first slit 193 may include a rectangular shape, a quadrangular shape, or other suitable shapes, but not limited thereto.

Please refer to FIG. 1 and FIG. 2 at the same time. In the normal direction of the substrate 100 (that is, on the Z-axis), the second slit 183 overlaps with the first slit 193. The second slit 183 has two opposite ends 1811 and 1821. The first transistor TFT1 overlaps with the end 1811 of the second slit 183. The second transistor TFT2 overlaps with the end 1821 opposite to the end 1811 of the second slit 183. In other words, the end 1811 of the second slit 183 is disposed adjacent to the end 1911 of the first slit 193. The end 1821 of the second slit 183 is disposed adjacent to the end 1921 of the first slit 193. In some embodiments, the two ends 1811 and 1821 of the second slit 183 may include arc-shaped edges, but not limited thereto.

In more detail, an extension direction of the second slit 183 is roughly parallel to the Y-axis. The second slit 183 has the first portion 181 and the second portion 182. The first portion 181 is connected to the second portion 182. The second slit 183 has a turning portion 184 connecting the first portion 181 and the second portion 182. The turning portion 184 is located between the first pixel electrode PE1 and the second pixel electrode PE2. An extension direction of the first portion 181 is different from an extension direction of the second portion 182. The extension direction of the first portion 181 and the extension direction of the second portion 182 may respectively form the included angles θ1 and θ2 with the Y-axis, and the extension directions intersect each other. In this way, the first portion 181 and the second portion 182 may form the ">" shape. The included angle θ1 and the included angle θ2 are greater than zero degrees and less than 90 degrees. In the embodiment, the included angle θ1 and the included angle θ2 are 10 degrees, but not limited thereto. An edge 181S of the first portion 181 is adjacent to the first bending portion DLA, and the edge 181S is parallel to the first bending portion DLA. An edge 182S of the second portion 182 is adjacent to the second bending portion DLB, and the edge 182S is parallel to the second bending portion DLB. In other embodiments, the second slit 183 may include a rectangular shape, a quadrangular shape, or other suitable shapes, but not limited thereto.

In some embodiments, an edge of the second slit 183 may be roughly parallel to an edge of the first slit 193, but not limited thereto. For example, the first portion 181 of the second slit 183 may be parallel to the first portion 191 of the first slit 193, but not limited thereto. In the normal direction of the substrate 100 (that is, on the Z-axis), the edge of the first slit 193 is located within the edge of the second slit 183, but not limited thereto. In a top view of the display device 10, an area of the second slit 183 is larger than an area of the first slit 193, but not limited thereto. In this way, the aperture ratio of the display device 10 can be maintained in a proper range, so that the display device 10 has good display quality.

Figure 4:
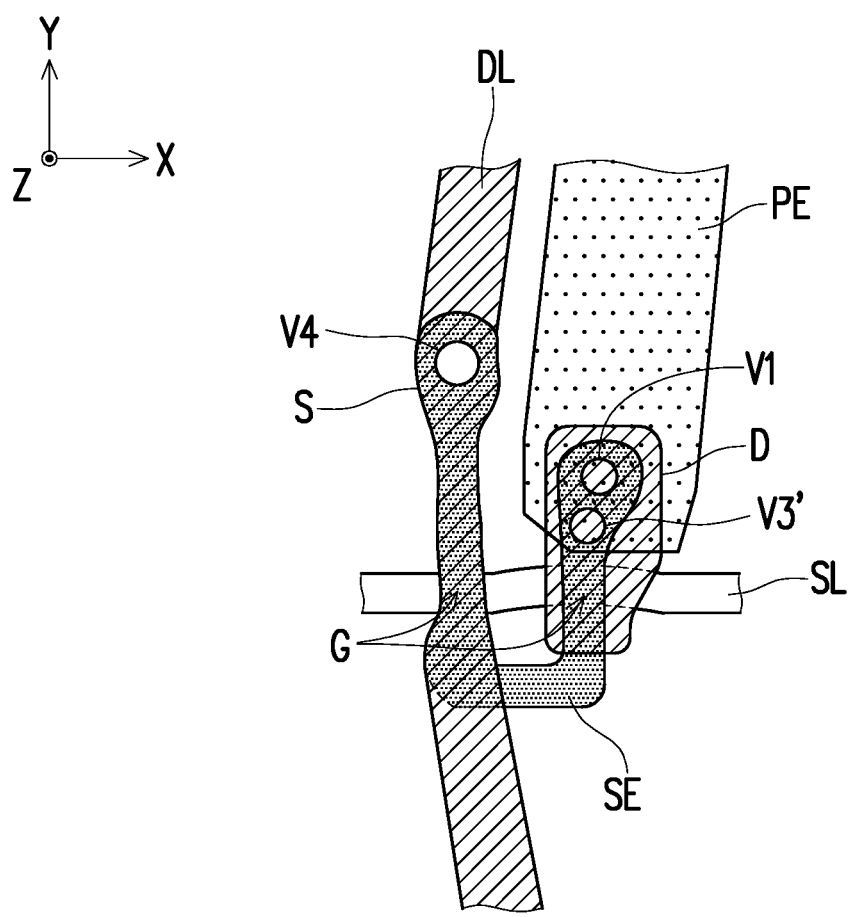
FIG. 4 is a top schematic view of an active element according to an embodiment of the disclosure.

FIG. 4 is a top schematic view of a transistor according to an embodiment of the disclosure. The transistor shown in FIG. 4 is, for example, a thin film transistor TFT in an embodiment of the disclosure. The thin film transistor TFT is electrically connected to the scanning line SL or the data line DL. For example, the semiconductor layer SE of the thin film transistor TFT may overlap with a portion of the scanning line SL. The portion of the scanning line SL overlapping with the semiconductor layer SE is, for example, the gate G. The semiconductor layer SE may be electrically connected to the data line DL or the source S (for example, the source S may be a portion of the data line DL) through a conductive via V4. In the embodiment, the semiconductor layer SE may be electrically connected to the drain D directly through the conductive via V1. The drain D may be electrically connected to a pixel electrode PE through a conductive via V3'. In other embodiments, the drain D of the semiconductor layer SE may also be first optionally connected to the bridging layer 150 (as shown in FIG. 1 and FIG. 3), and then connected to the pixel electrode PE through the bridging layer 150.

It should be noted that FIG. 4 only shows a possible form of the transistor according to an embodiment of the disclosure and is not intended to limit the shape or connection relationship of the transistor. In other embodiments, the transistor may have a different appearance, which still falls within the protection scope of the disclosure.

Figure 5:
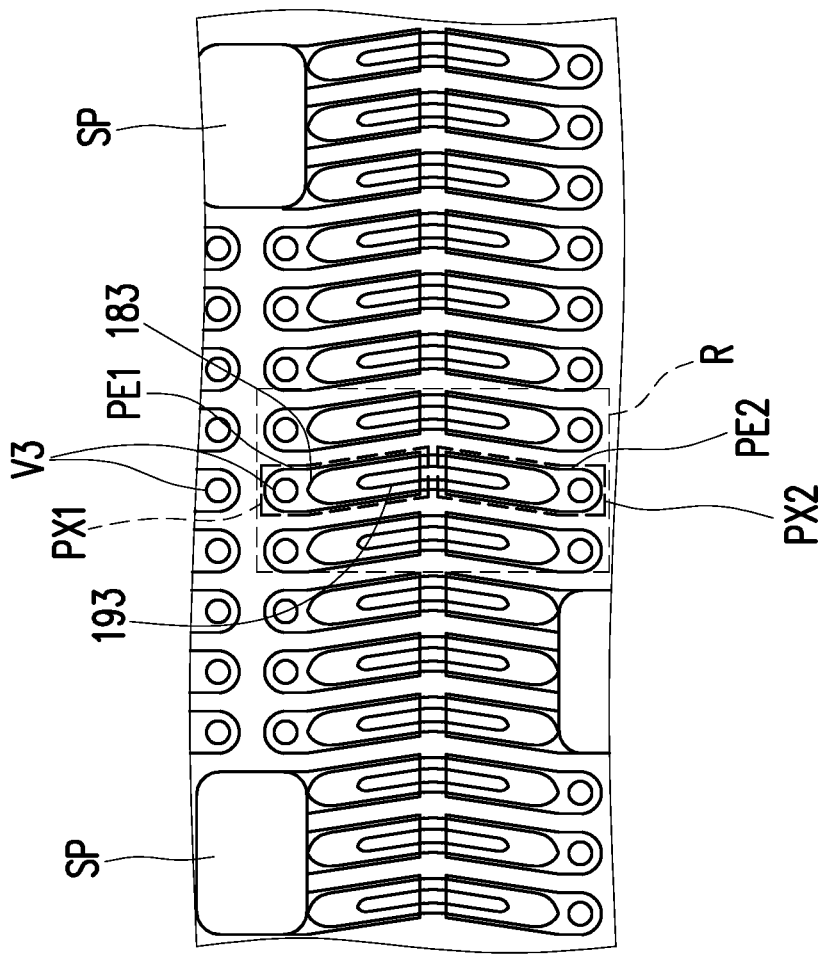
FIG. 5 is a top schematic view of a pixel array of a display device according to an embodiment of the disclosure.
Figure 6:
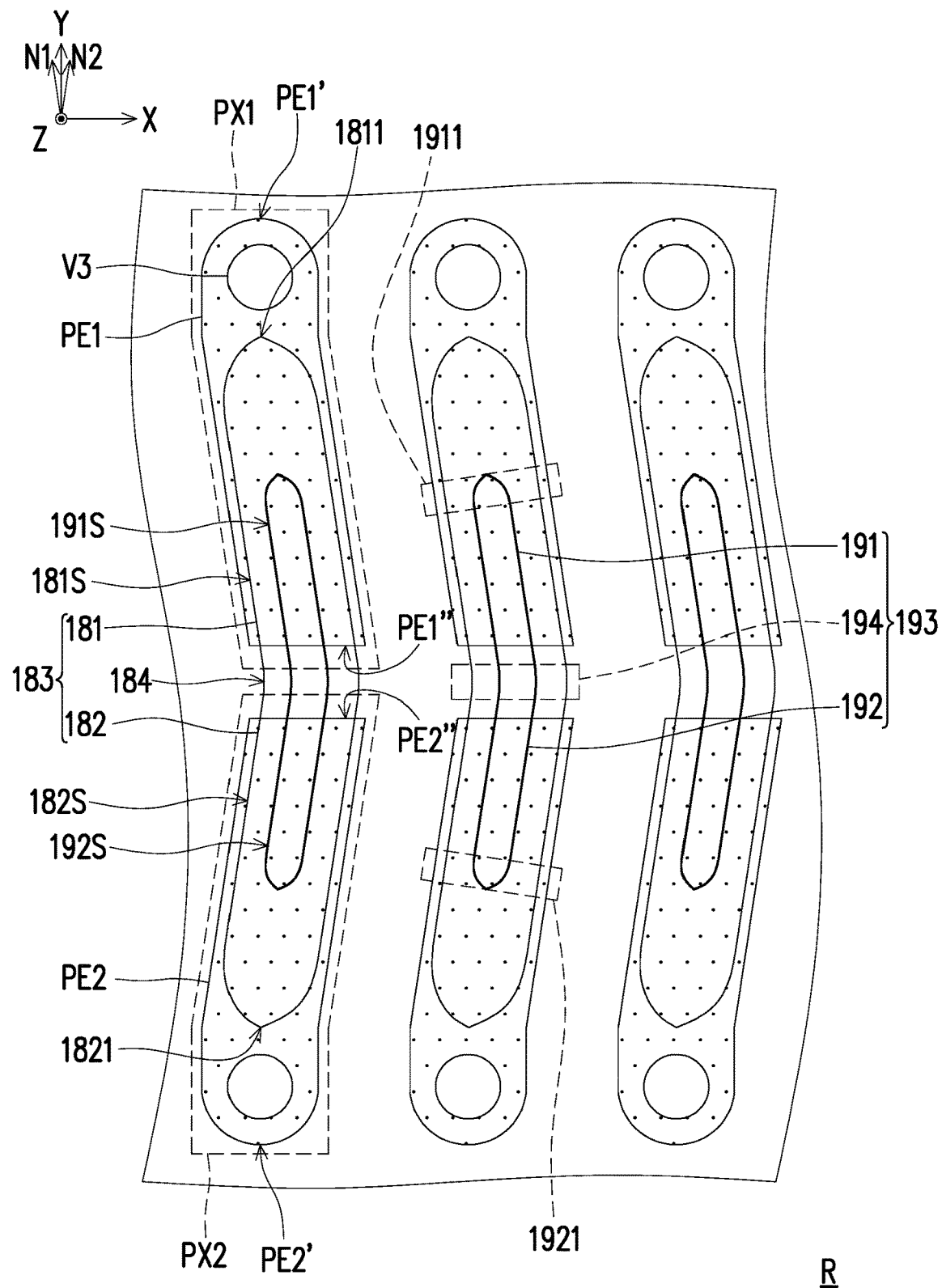
FIG. 6 is a top schematic view of a region R of the pixel array of FIG. 5.

FIG. 5 is a top schematic view of a pixel array of a display device according to an embodiment of the disclosure. FIG. 5 omits showing several elements. FIG. 6 is a top schematic view of a region R of the pixel array of FIG. 5. FIG. 6 omits showing several elements.

Please refer to FIG. 5 first. The display device shown in FIG. 5 includes a pixel array. The pixel array includes multiple first pixels PX1 arranged into columns along the X-axis and multiple second pixels PX2 arranged into columns along the X-axis. The first pixel PX1 and the second pixel PX2 are adjacently disposed on the Y-axis. One end of the first pixel electrode PE1 and one end of the second pixel electrode PE2 are electrically connected to different transistors respectively through different conductive vias V3. From another point of view, one end of the first pixel electrode PE1 (away from the conductive via V3) is adjacent to one end of the second pixel electrode PE2 (away from the conductive via V3). In addition, in the embodiment, the transistors electrically connected to the pixels in different rows may share the semiconductor layer. In other words, one end of the pixel electrode (near the conductive via V3) and one end of another pixel electrode (near the conductive via V3) may be adjacently disposed. In this way, under the requirement of high-resolution display, the display device 10 can maintain the aperture ratio. Therefore, the display device 10 has good display quality.

In some embodiments, the display device 10 further includes a spacer SP. The spacer SP may overlap with a position where the pixel electrode is connected to the conductive via V3, but not limited thereto. The material of the spacer SP includes an insulating material, but not limited thereto.

The region R shown in FIG. 6 includes, for example, three pairs of the first pixel electrode PE1 and the second pixel electrode PE2 disposed in pairs on the Y-axis. The first slit 193 and the second slit 183 respectively span from the first pixel electrode PE1 to the second pixel electrode PE2. The second slit 183 overlaps with the first slit 193. More specifically, the edge of the first slit 193 may be located within the edge of the second slit 183. The end 1911 of the first slit 193 is disposed near the end 1811 of the second slit 183. The end 1921 of the first slit 193 is disposed near the end 1821 of the second slit 183. The conductive vias V3 are respectively located outside two opposite ends (for example, the end 1911 and the end 1921) of the first slit 193.

The end PE1' of the first pixel electrode PE1 is electrically connected to the thin film transistor through the conductive via V3. The end PE2' of the second pixel electrode PE2 is electrically connected to the thin film transistor (not shown) through the conductive via V3. The end PE1" of the first pixel electrode PE1 is adjacent to the end PE2" of the second pixel electrode PE2. The end 1911 of the first slit 193 is disposed near the end PE1' of the first pixel electrode PE1, and the end 1921 of the first slit 193 is disposed near the end PE2' of the second pixel electrode PE2. The turning portion 194 between the first portion 191 and the second portion 192 and the turning portion 184 between the first portion 181 and the second portion 182 are disposed between the end PE1" of the first pixel electrode PE1 and the end PE2" of the adjacent second pixel electrode PE2. In the embodiment, the turning portion 194 may be defined as a region counting from the start of an edge of the first portion 191 extending in the first direction N1 toward the second direction N2 to the start of the second portion 192 extending in the second direction N2. In addition, the definition of the turning portion 184 may be the same as the definition of the turning portion 194 described above, but not limited thereto.

In some embodiments, the end 1911 and the end 1921 of the first slit 193 are represented by dashed boxes in FIG. 6. In the embodiment, the end 1911 and the end 1921 may be defined as counting from a point where the width starts to change and have arc-shaped edges. The first slit 193 has the turning portion 194 connecting the first portion 191 and the second portion 192. In addition, the definitions of the end PE1' of the first pixel electrode PE1, the end PE2' of the second pixel electrode PE2, and the two ends 1811 and 1821 of the second slit 183 may be the same as the definitions of the end 1911 and the end 1921, which are counting from a point where the width starts to change and have arc-shaped edges, but not limited thereto.

In some embodiments, the edge 181S of the first portion 181 of the second slit 183 is parallel to the edge 191S of the first portion 191 of the first slit 193 and extends in the first direction N1. The edge 182S of the second portion 182 of the second slit 183 is parallel to the edge 192S of the second portion 192 of the first slit 193 and extends in the second direction N2. In other words, the first slit 193 and the second slit 183 may be two slits disposed in parallel, but not limited thereto.

Under the above configuration, the aperture ratio of the display device 10 can be maintained in a proper range, so that the display device 10 has good display quality.

Figure 7:
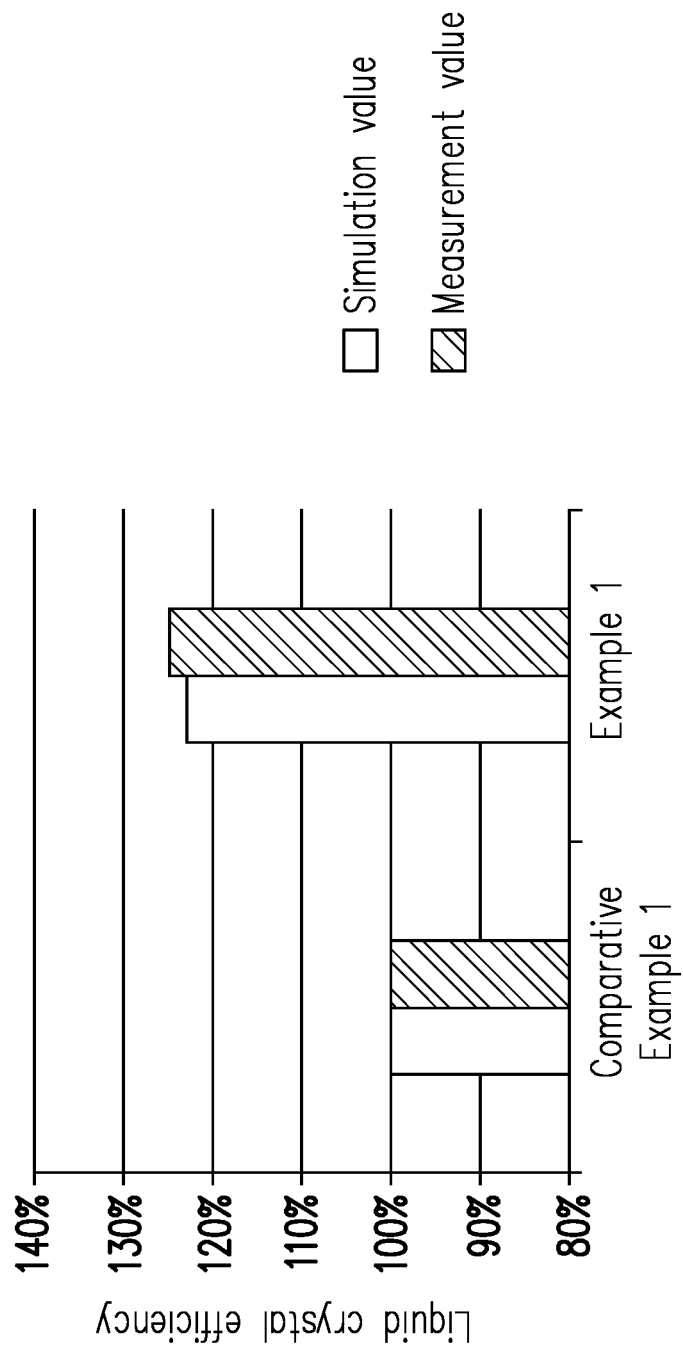
FIG. 7 is a histogram of liquid crystal efficiency of a display device according to an embodiment of the disclosure.

FIG. 7 is a histogram of liquid crystal efficiency of a display device according to an embodiment of the disclosure.

In some embodiments, the measurement method of the liquid crystal efficiency is briefly described as follows.

Firstly, an upper polarizer and a lower polarizer are respectively disposed on upper and lower sides of the display device 10. An optical axis of the upper polarizer and an optical axis of the lower polarizer are perpendicular.

Next, the display device 10 is turned on to drive the liquid crystal molecules.

Then, a backlight module is provided and the light transmittance of the display device 10 is measured. The measured light transmittance is a first light transmittance W.

Then, after removing the upper polarizer, the upper polarizer is reset. At this time, the optical axis of the upper polarizer and the optical axis of the lower polarizer are parallel.

Then, the backlight module is provided and the light transmittance of the display device 10 is measured. The measured light transmittance is a second light transmittance C. When measuring the second light transmittance C, the display device 10 is not turned on. In other words, the second light transmittance C is used as a reference.

Then, the liquid crystal efficiency is calculated with Equation 1 below.

$$W/C = LC_{eff}$$

Where W is the first light transmittance, C is the second light transmittance, and $LC_{eff}$ is the liquid crystal efficiency. The second light transmittance C is, for example, a fixed value, which depends on the manufacturing process and material of the display device 10.

It can be seen from Equation 1 that the greater the first light transmittance W, the higher the liquid crystal efficiency, and the better the display quality of the display device 10.

In the disclosure, the liquid crystal efficiency of a pixel structure PX' of Comparative Example 1 was used as a reference (in other words, the liquid crystal efficiency of Comparative Example 1 was set to 100%). The value of the liquid crystal efficiency of a pixel structure PX of Example 1 under computer simulation, such as about 120%, was higher than the liquid crystal efficiency of Comparative Example 1. Under actual product measurement, the obtained value of the liquid crystal efficiency of the pixel structure PX of Example 1 was higher than the liquid crystal efficiency of Comparative Example 1. In this way, the area of bright fringes of the pixels may be increased. The display device 10 can have good display quality. In the disclosure, the liquid crystal efficiency of the pixel structure PX can be increased by about 20%. In other embodiments, such effect can be obtained as long as the liquid crystal efficiency of the embodiment is higher than the reference.

In summary, in the display device of an embodiment of the disclosure, since the first slit spans from the first pixel electrode to the second pixel electrode, the horizontal lateral electric field generated by the first slit and the first pixel electrode or the second pixel electrode may be increased, or the vertical lateral electric field generated by the first slit and the first pixel electrode or the second pixel electrode may be reduced. Therefore, the liquid crystal efficiency of the pixels can be improved, thereby increasing the area of bright fringes of the pixels. The display device can have good display quality.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments may still be modified or part or all of the technical features may be equivalently replaced. However, the modifications or replacements do not cause the essence of the corresponding technical solutions to deviate from the scope of the technical solutions of the embodiments of the disclosure.

What is claimed is:

1. A display device, comprising:
   a substrate;
   a transistor, disposed on the substrate;
   a pixel electrode, disposed on the substrate and electrically connected to the transistor;
   a first conductive layer, disposed on the pixel electrode and having a first slit; and
   a second conductive layer, disposed on the pixel electrode and having a second slit,
   wherein the second conductive layer is disposed between the pixel electrode and the first conductive layer;
   wherein two ends of the first slit and two ends of the second slit comprise arc-shaped edges and the first slit and the second slit are overlapped with the pixel electrode.

2. The display device according to claim 1, wherein the second slit overlaps the first slit.

3. The display device according to claim 1, wherein an area of the second slit is larger than an area of the first slit.

4. The display device according to claim 3, wherein a material of the second conductive layer comprises molybdenum, and a material of the first conductive layer comprises indium tin oxide.

5. The display device according to claim 1, wherein a material of the second conductive layer comprises molybdenum, and a material of the first conductive layer comprises indium tin oxide.

6. The display device according to claim 1, further comprising:
   a scanning line disposed on the substrate and electrically connecting to the transistor, wherein the second conductive layer overlaps the scanning line.

7. The display device according to claim 1, further comprising:
   a data line disposed on the substrate and electrically connecting to the transistor, wherein the second conductive layer overlaps the data line.

8. The display device according to claim 1, further comprising:
   a data line and a scanning line disposed on the substrate and electrically connecting to the transistor, wherein the second conductive layer overlaps the scanning line and the data line.

9. The display device according to claim 1, further comprising:
   an insulation layer, disposed on the substrate; and
   a light shielding layer, disposed between the substrate and the insulation layer, wherein the transistor comprises a semiconductor layer and the light shielding layer overlaps the semiconductor layer.

10. The display device according to claim 1, further comprising:
    a first scanning line disposed on the substrate and electrically connecting to the transistor, and
    a second scanning line disposed on the substrate and adjacent to the first scanning line, wherein the first slit and the second slit are disposed between the first scanning line and second scanning line.

11. The display device according to claim 1, wherein a maximum length of the first slit is less than a maximum length of the second slit.

* * * * *